(12) United States Patent
Kim

(10) Patent No.: US 8,803,238 B2
(45) Date of Patent: Aug. 12, 2014

(54) PLASMA-INDUCED DAMAGE (PID) PROTECTIVE DIODE IN AN OPEN REGION OF A WELL GUARD TO INCREASE THE DEGREE OF INTEGRATION OF TRANSUSTOR OF SEMICONDUCTOR DEVICE

(75) Inventor: Yong-Ho Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 332 days.

(21) Appl. No.: 13/280,729

(22) Filed: Oct. 25, 2011

(65) Prior Publication Data
US 2012/0104499 A1    May 3, 2012

(30) Foreign Application Priority Data
Oct. 27, 2010    (KR) .................. 10-2010-0105173

(51) Int. Cl.
*H01L 23/62*    (2006.01)
*H01L 27/02*    (2006.01)
*H01L 29/06*    (2006.01)

(52) U.S. Cl.
CPC ........ *H01L 27/0255* (2013.01); *H01L 29/0692* (2013.01); *H01L 29/0619* (2013.01)
USPC .................................. 257/359; 257/E23.002

(58) Field of Classification Search
CPC ............ H01L 27/0255; H01L 29/0692; H01L 29/0619
USPC .......................................... 257/356, E23.002
See application file for complete search history.

(56) References Cited

FOREIGN PATENT DOCUMENTS

| KR | 100307554 | 11/2001 |
|----|-----------|---------|
| KR | 100482363 | 8/2005 |
| KR | 100745911 | 8/2007 |
| KR | 100817094 | 3/2008 |

*Primary Examiner* — Stephen W Smoot
*Assistant Examiner* — Vicki B Booker
(74) *Attorney, Agent, or Firm* — IP & T Group LLP

(57) ABSTRACT

To increase the integration degree of a semiconductor device, the semiconductor device having a Plasma-Induced Damage (PID) protective diode includes a well, at least a first transistor region formed over the well, a gate electrode formed over the first transistor region, a well guard disposed to include an open region while surrounding the first transistor region, a diode disposed in the open region, and a metal line configured to electrically connect the gate electrode and the diode. A space between transistor regions may be efficiently reduced, thus increasing the integration degree of a semiconductor device.

9 Claims, 4 Drawing Sheets

PLASMA-INDUCED DAMAGE (PID) PROTECTIVE DIODE IN AN OPEN REGION OF A WELL GUARD TO INCREASE THE DEGREE OF INTEGRATION OF TRANSUSTOR OF SEMICONDUCTOR DEVICE

CROSS-REFERENCE TO RELATED APPLICATIONS

The present application claims priority of Korean Patent Application No. 10-2010-0105173, filed on Oct. 27, 2010, which is incorporated herein by reference in its entirety.

BACKGROUND

1. Field

Exemplary embodiments of the present invention relate to a semiconductor device, and more particularly, to a semiconductor device for preventing plasma-induced damage (PID).

2. Description of the Related Art

Semiconductor devices are highly integrated and continue to get smaller and smaller. The shrinking technology means the space between patterns formed on the surface of a wafer also shrinks, and the aspect ratio increases. Here, new issues in semiconductor manufacturing and fabrication processes arise.

For example, issues arise in a fabrication process using plasma. More specifically, as a deposition process or an etch process is performed using plasma, plasma-induced damage (PID) occurs and deteriorates some properties of a semiconductor device.

PID is the damage occurring in a semiconductor fabrication process using plasma, and it occurs because plasma contains ions that discharge charges into a wafer through an interaction between the plasma ions and the wafer.

There are many factors that affect PID, such as ions that are formed as plasma and ultraviolet radiation. Particularly, charging of a wafer with ions is known as a major factor for PID.

FIGS. 1 and 2 illustrate PID occurring in conventional technology.

Referring to FIG. 1, a source gas is supplied and plasma is generated in deposition and etching processes that use plasma, and there are excited molecules, radicals, ions Ji, and electrons Je in the generated plasma. The electrons Je and the ions Ji have predetermined energy levels and enter a wafer 100. Here, the amount of electrons Je and ions Ji that enter the wafer 100 are the same, but due to a difference in distribution speed, almost all of the ions Ji enter the surface of the wafer 100 vertically, and the electrons Je enter the surface of the wafer 100 at predetermined angles. During this process, when there is no structure, such as a pattern, on the wafer 100, both the ions Ji and the electrons Je enter the wafer and the wafer 100 maintains a balanced charge. However, when there is a pattern, the charge balance between the ions Ji and the electrons Je is broken.

More specifically, as illustrated in FIG. 2, when there is a pattern 210 on a wafer 200, most ions Ji enter the surface of the wafer 200 vertically. However, the entering path of the electrons Je is obstructed by the pattern 210 and the electrons Je do not enter through the pattern 210 but are reflected out. Therefore, the number of electrons Je entering the wafer 200 between the patterns 210 is decreased. As a result, the amount of the electrons Je entering the sidewalls of the pattern 210 is more than the amount of the ions Ji, and the sidewalls of the upper portion of the pattern 210 are charged with negative (−) charges. Also, the surface of the wafer 200 between the patterns 210 is charged with positive (+) charges from the ions Ji. This charging effect becomes more evident as a device is highly integrated and the patterns 210 are formed more delicately. Accordingly, when the wafer 200 is electrically isolated, the sidewalls of the pattern 210 are charged with negative (−) charges due to the electrons Je, while the portion where the pattern 210 meets the surface of the wafer 200 is charged with positive (+) charges.

Also, a spatial uniformity of the plasma varies according to the environment of a piece of equipment or a plasma condition, and thus the charging density of the wafer 200 is further imbalanced.

The deposition and etching processes using plasma are mostly performed on the surface of a non-conductive material, such as a dielectric material, e.g., silicon oxide ($SiO_2$). As a non-uniform charging density is formed in the wafer 200 and the pattern 210 in the way described above, a current is generated that flows from a portion with high charging density to a portion with low charging density as a reaction to the non-uniform charging density. The current flows through a device inside of the wafer, for example, in a gate insulation layer, so as to apply an electrical stress to a semiconductor device. This generated current also causes PID, such as an electron trap and a leakage current path inside of the gate insulation layer.

More specifically, a field strong to a thin metal line is formed due to the non-uniform charging density, and because of the strong field, the metal line becomes molten.

Also, a potential level difference between a gate and a bulk is raised due to the strong field and a gate oxide layer may be damaged.

Moreover, the non-uniform charging density affects a threshold voltage of a transistor and changes the properties of the transistor.

According to a conventional technology for preventing the PID, any non-uniform charging density is addressed by inserting a protective diode to provide the ions with an artificial path through which the ions may be drained. According to the conventional technology, when a well area is large, a protective diode is formed for each transistor region.

FIG. 3 is a layout illustrating a conventional semiconductor device with a PID protective diode inserted thereto.

Referring to FIG. 3, a path through which charges may be drained is formed as a gate electrode 32 of a transistor region Tr1 to be protected from PID is coupled with a diode 34 in the conventional semiconductor device with a PID protective diode inserted thereto.

More specifically, the transistor region Tr1 and a well guard 31 of a structure surrounding the transistor region Tr1 are disposed over a well 30. The well guard 31 is disposed on the boundaries of the well 30 and circuits inside of the well guard 31 constitute one circuit block. The well guard 31 prevents a latch-up from occurring among adjacent circuit blocks. A bias of a predetermined level is applied as a pick-up and is formed in the well guard 31.

A gate electrode 32 is formed over the transistor region Tr1, and the diode 34 is disposed to be spaced apart from the transistor region Tr1 by a space S.

A metal line 33 is disposed over an upper layer of the diode 34 to overlap with the diode 34. The metal line 33 is coupled with the gate electrode 32 through a contact plug CG, and coupled with the diode 34 through a contact plug CD.

According to the conventional technology, however, the layout area is greatly increased in size due to the disposition of the protective diode 34. This increase in layout area size tends to prevent further integration.

As shown in FIG. 3, when independent transistor regions Tr2 and Tr3 are disposed on the right and left sides of the transistor region Tr1, a space between transistor regions Tr1 and Tr2 is greater than a space between transistor regions Tr1 and Tr3 because of the disposition of the diode 34. A space between transistor region Tr1 and transistor region Tr3 corresponds to a space S. Whereas the space between transistor regions Tr1 and Tr2 corresponds to S, a space between the diode 34 and the transistor region Tr1, S, a space between transistor region Tr2 and the diode 34, plus a width W of the diode 34. This additional space for placing the diode 34 prevents further integration of the semiconductor device.

Therefore, it is useful to efficiently dispose a PID protective diode in order to increase the integration degree of the semiconductor device.

SUMMARY

An embodiment of the present invention, which is devised to address the above-discussed features of conventional technology, is directed to provide a semiconductor device having a Plasma-Induced Damage (PID) protective diode that is inserted and disposed without requiring an additional area.

In accordance with an embodiment of the present invention, a semiconductor device includes a well, at least a first transistor region formed over the well, a gate electrode formed over the transistor region, a well guard disposed to include an open region while surrounding the transistor region, a diode disposed in the open region, and a metal line configured to electrically connect the gate electrode and the diode.

DETAILED DESCRIPTION

Figure 1:
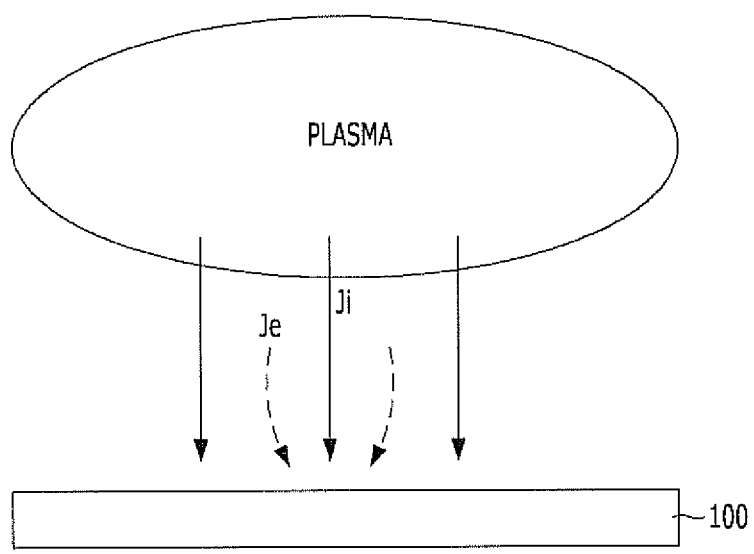
FIGS. 1 and 2 illustrate Plasma-Induced Damage (PID) occurring in conventional technology.
Figure 2:
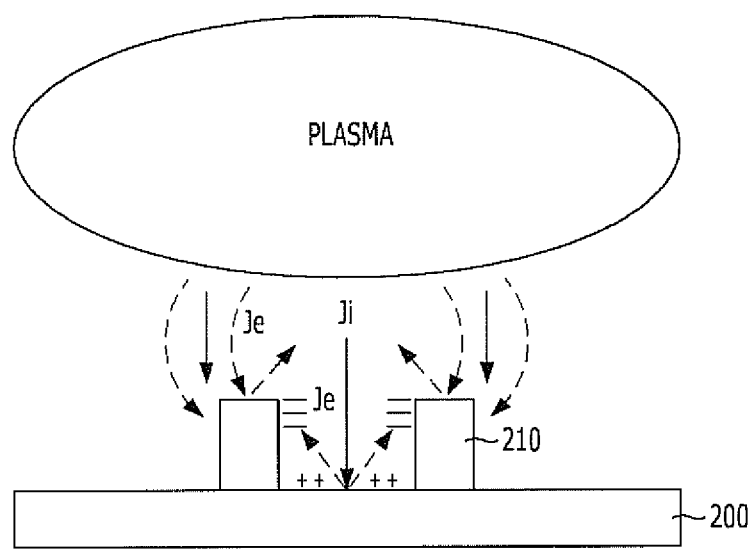
Figure 3:
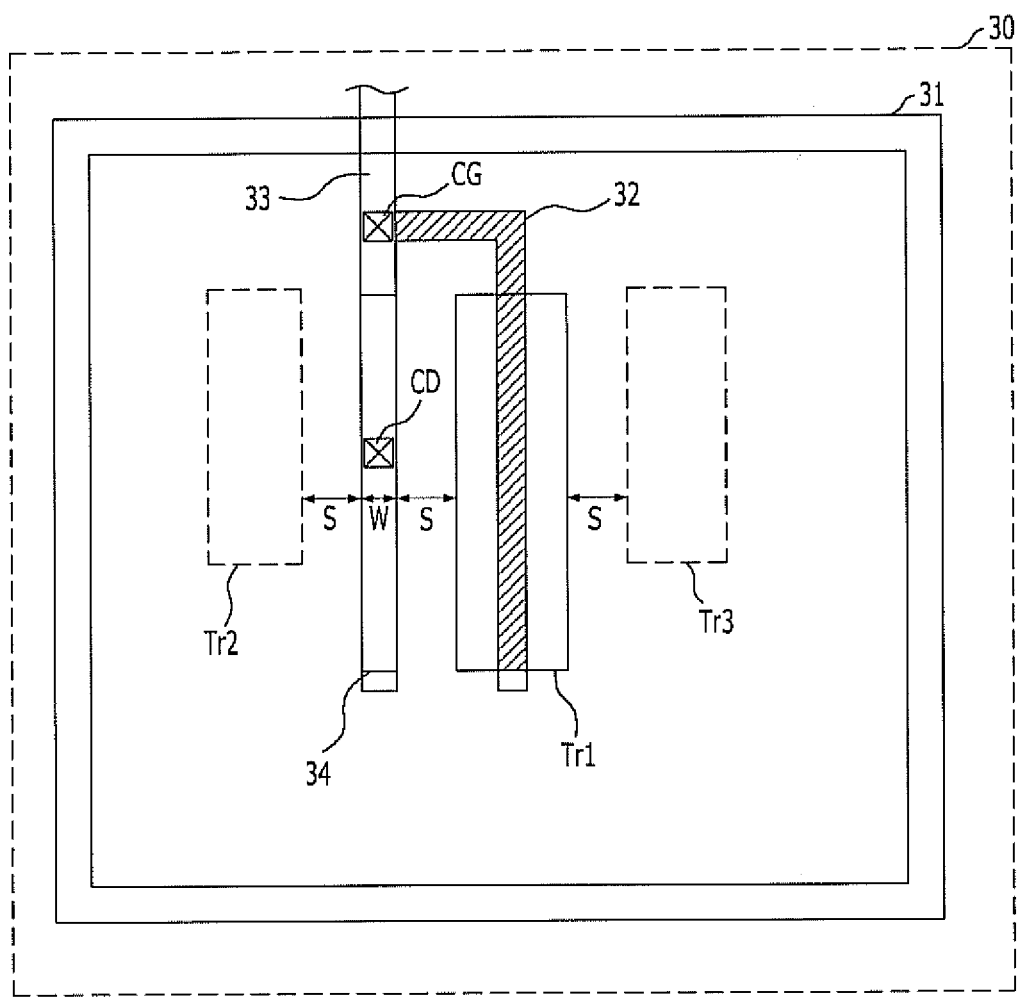
FIG. 3 is a layout illustrating a semiconductor device with a PID protective diode inserted thereto, according to the conventional technology.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

According to an embodiment of the present invention, a portion of a well guard is removed and a diode is formed in the region from which the portion of the well guard is removed in order to insert and dispose a Plasma-Induced Damage (PID) protective diode so that an additional area for the PID protective diode is not needed.

Figure 4:
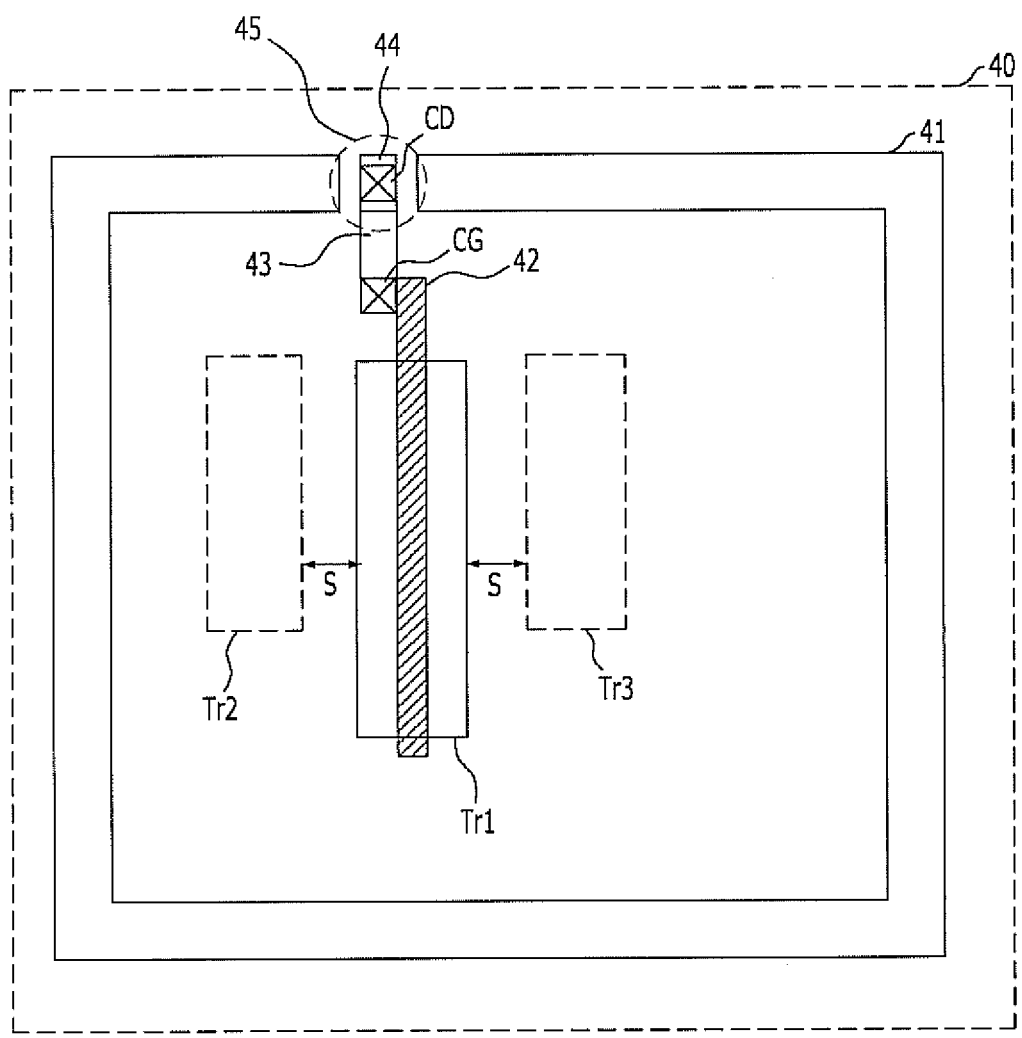
FIG. 4 is a layout illustrating a semiconductor device with a PID protective diode inserted thereto in accordance with an embodiment of the present invention.

FIG. 4 is a layout illustrating a semiconductor device with a PID protective diode inserted thereto in accordance with an embodiment of the present invention. For illustration purposes, the embodiment of the present invention is described with focus on the diode and a transistor region to be protected.

Referring to FIG. 4, in the semiconductor device with a PID protective diode in accordance with an embodiment of the present invention, a transistor region Tr1 is disposed over an N-type or a P-type well 40, and a gate electrode 42 is formed over the transistor region Tr1. According to an embodiment of the present invention, a well guard 41 having a structure of surrounding the transistor region Tr1 is disposed. The well guard 41 is not a closed structure but includes a partially open region 45.

A diode 44 may be doped with a P-type or an N-type impurity according to the kind of the well 40 that is disposed in the open region 45 of the well guard 41. For example, when the well 40 is of an N type, the diode 44 is doped with a P-type impurity, and when the well 40 is of a P type, the diode 44 is doped with an N-type impurity.

If the diode 44 is formed in the well guard 41, the diode 44 is shorten. So, the well guard 41 is formed of the structure including the partially open region 45 and the diode 44 is formed in the open region 45 of the well guard 41.

The diode 44 is coupled with the gate electrode 42 through a metal line 43 that may be disposed over the diode 44 and the gate electrode 42. The diode 44 is electrically connected to the metal line 43 through a contact plug CD, and the gate electrode 42 is electrically connected to the metal line 43 through a contact plug CG.

As a result, the charges trapped in the gate electrode 42 may be safely discharged through the diode 44.

According to an embodiment of the present invention, the disposition of a diode does not affect the space between the transistor regions, which is different from conventional technology. In short, although a PID protective diode is inserted, the space between a plurality of transistor regions within a circuit block is not affected.

For example, when transistor regions Tr2 and Tr3 are disposed parallel to the transistor active Tr1, the space between the transistor regions requires only an area corresponding to the space 5 between transistor regions. Therefore, although a PID protective diode is inserted, the area of the semiconductor device is not increased. In short, the integration degree within the semiconductor device may be increased.

Also, when a diode is disposed according to an embodiment of the present invention, the space between transistor regions may be efficiently reduced, thus increasing the integration degree of a semiconductor device.

While the present invention has been described with respect to the specific embodiments, it will be apparent to those skilled in the art that various changes and modifications may be made without departing from the spirit and scope of the invention as defined in the following claims.

What is claimed is:

1. A semiconductor device, comprising:
a well;
at least a first transistor region formed over the well;
a gate electrode formed over the first transistor region;
a well guard including an open region and surrounding the first transistor region;
a diode disposed in the open region; and
a metal line configured to electrically connect the gate electrode and the diode.

2. The semiconductor device of claim 1, wherein the diode is a Plasma-Induced Damage (PID) protective diode.

3. The semiconductor device of claim 1, wherein the metal line is electrically connected to the gate electrode and the diode by contact plugs.

4. The semiconductor device of claim 2, wherein charges accumulated in the gate electrode from a fabrication process using plasma are discharged through the Plasma-Induced Damage (PID) protective diode.

5. The semiconductor device of claim 1, further comprising a second transistor region and a third transistor region.

6. The semiconductor device of claim 5, wherein the second transistor region and the third transistor region are disposed in parallel to the first transistor region.

7. The semiconductor device of claim 5, wherein the second and the third transistor regions are formed over the well.

8. The semiconductor device of claim 6, wherein the first transistor region is disposed in between the second transistor region and the third transistor region.

9. The semiconductor device of claim 8, wherein a space between the second transistor region and the first transistor region and a space between the third transistor region and the first transistor region is substantially similar and the disposition of the diode is outside the second transistor region and the first transistor region and the space between the third transistor region and the first transistor region.

* * * * *